United States Patent
Huang

(10) Patent No.: US 6,589,842 B2
(45) Date of Patent: Jul. 8, 2003

(54) MANUFACTURING METHOD OF A GATE-SPLIT FLASH MEMORY

(75) Inventor: Shui-Chin Huang, Tainan (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/855,129

(22) Filed: May 14, 2001

(65) Prior Publication Data

US 2002/0068403 A1 Jun. 6, 2002

(30) Foreign Application Priority Data

Dec. 5, 2000 (TW) .................................. 89125880 A

(51) Int. Cl.⁷ ............................................ H01L 21/336

(52) U.S. Cl. ...................................... 438/261; 438/267

(58) Field of Search ............................... 438/257, 258, 438/261, 263, 264, 266, 267, 424

(56) References Cited

U.S. PATENT DOCUMENTS

| 5,278,087 | A | | 1/1994 | Jenq ............................ 437/43 |
| 5,940,706 | A | | 8/1999 | Sung et al. ................. 438/261 |
| 6,133,097 | A | * | 10/2000 | Hsieh et al. |
| 6,420,232 | B1 | * | 7/2002 | Wu |

\* cited by examiner

*Primary Examiner*—Phuc T. Dang
(74) *Attorney, Agent, or Firm*—Ladas & Parry

(57) ABSTRACT

The present invention relates to discloses a manufacturing method of a gate-split flash memory, which is suitable for a self-align contact process and fully-salicide-compatible process. The present invention masks the invalid peaks with a thick passivation layer to obtain the purpose of removing the invalid peaks in the manufacturing process of a gate-split flash memory. The present invention deposits a nitride spacer to define a pattern of a floating gate of the flash memory, so that a channel length of the floating gate can be finely defined. The present invention also utilizes a mask pattern to define the floating gate region of the flash memory, and the manufacturing process will be smooth and cheap.

18 Claims, 10 Drawing Sheets

MANUFACTURING METHOD OF A GATE-SPLIT FLASH MEMORY

BACKGROUND OF THE INVENTION

1. Field of the Invention

The present invention relates to a manufacturing method of a gate-split flash memory, and particularly to a manufacturing method of a gate-split flash memory which can remove unnecessary peaks in a floating gate polysilicon region.

2. Description of Related Art

For a prior art manufacturing method of a flash memory, a source region of the flash memory is manufactured by a similar resist-stripping way. Therefore, if there is a demand to reduce the size of the flash memory, a STI technology is always used, which separates the source region into several parts and connecting them by a plurality of local wires. A disadvantage of the STI technology is incompatible with the process of the modern gate-split flash memory. A prior art method which increases a barrier oxide layer to generate a self-aligned salicide floating memory will cause unequal gate lengths and bad removal rate. Generally speaking, if a misalignment happens in defining the floating gate by a pattern of a mask, the channel length and operational characteristic of the flash memory will be heavily affected. Several prior arts, which disclose how to avoid misalignment of a split control gate, can be found in U.S. Pat. Nos. 5,278,087 and 5,940,706. Meanwhile, the prior art also discloses another method of utilizing a spacer to define a floating gate and avoid asymmetric situations when utilizing a mask.

FIGS. 1(a)–(j) shows a prior art manufacturing flow of the flash memory using a self-align contact process. In FIG. 1(a), a flash memory 10 includes a substrate (such as a P-type carrier) 101, a tunnel dielectric layer 102, a first polysilicon 103 acting as a floating gate, a silicon nitride layer (such as $Si_4N_4$) 104 and a resist 105 acting as a channel mask. The resist 105 has an opening 120 for forming the region of the floating gate. In FIG. 1(b), the silicon nitride layer 104 corresponding to the opening 120 is etched. In FIG. 1(c), a polysilicon-oxide region 106 is formed by thermal oxidation, and is represented by a cross section of an ellipse. FIG. 1(d) is a cross-sectional view taken from another direction. In FIG. 1(e), the polysilicon-oxide region 106 is used as a hard mask, that used in removing all polysilicon except that under the polysilicon-oxide region 106 forming a separate floating gate, which is called "floating gate polysilicon" 117. In FIG. 1(f), a polysilicon layer 111 acts as a control gate, on which a W-silicide layer 107 (such as $Wsi_x$) and a silicon nitride layer 108 (such as a cap SiN) are deposited in order. Two peaks 115 and 116 are formed on two sides of the top surface of the floating gate polysilicon 117. Generally speaking, a field emission functions as one method to erase data stored in a non-volatile memory, and has been largely used. When the function of the field emission is utilized, peaks on the floating gate must be generated first. However, only below the control gate, the peak can develop the function of field emission, and peaks on the other places not only fail to develop the function of field emission, but also affect an yield of the salicide process. For example, in FIG. 1(f), the peak 115 beneath the control gate 111 can erase the data of the flash memory by utilizing the function of field emission, but the peak 116 has not the function and is an invalid one. In FIG. 1(g), after an annealing process, a NLDD region 110 and N+ region 109 are formed by an ion implantation process. In FIG. 1(h), a spacer dielectric 112 is deposited, and a spacer etching is executed, and the invalid peak 116 would be exposed, causing a short circuit or a current leakage between the polysilicon-oxide region and source region. In FIG. 1(i), a barrier layer 113 is deposited to prevent contacts inside the flash memory from being etched. In FIG. 1(j), an inter-layer-dielectric (ILD) 114 is deposited and oxide in the source region is removed.

FIGS. 2(a)–(d) shows another prior art manufacturing flow of the flash memory using a fully salicide-compatible process. The first flows of the manufacturing method of the an other prior art is the same as those shown in FIGS. 1(a)–(e). In FIG. 2(a), a polysilicon layer 111 is deposited In FIG. 2(b), an annealing process is first executed, and a NLDD region 110 and N+ region 109 are formed by an ion implantation process. In FIG. 2(c), a spacer dielectric 112 is deposited, a spacer etching is executed, and the invalid peak 116 will be exposed, causing the floating gate to be salicided. In FIG. 2(d), for a stand-alone memory process, W-silicide is utilized as the material of a third polysilicon layer 118; for an embedded memory process, Ti-silicide is used as the material of the third polysilicon layer 118.

In conclusion, the peaks only beneath the control gate have the ability of erasing data stored in the flash memory, and peaks on the other positions do not have the ability and lead to a short circuit, current leakage or being salicided, because they are exposed outside the control gate after a spacer etching is executed. Besides, when the oxide in the source region is etched, the oxide in the floating gate will be also etched. In this circumstance, if the contacts inside the flash memory are etched, the channel length between the source region and floating gate will be shortened and an error will happen.

SUMMARY OF THE INVENTION

A first object of the present invention is to eliminate the disadvantage of generating invalid peaks in the prior art manufacturing process of a gate-split flash memory. The present invention masks the invalid peaks with a thick passivation layer to obtain the purpose of removing the invalid peaks in the manufacturing process of the flash memory. The present invention is suitable to two main processes for the gate-split flash memory. The two processes are self-align contact process and fully-salicide-compatible process.

A second object of the present invention is to propose a manufacturing method of keeping a complete channel length of the flash memory. In the self-align contact process, the present invention deposits a nitride spacer to define a pattern of the floating gate of the flash memory, so that the channel length of the floating gate can be finely defined. In the fully-salicide-compatible process, the present invention utilizes a mask pattern to define the floating gate region of the flash memory, and the manufacturing process will be smooth and cheap.

BRIEF DESCRIPTION OF THE DRAWINGS

The present invention will be described according to the appended drawings in which:

FIGS. 4(a2)~(e2) show a manufacturing flow of a floating gate polysilicon mask according to the present invention.

PREFERRED EMBODIMENT OF THE PRESENT INVENTION

Figure 1A:
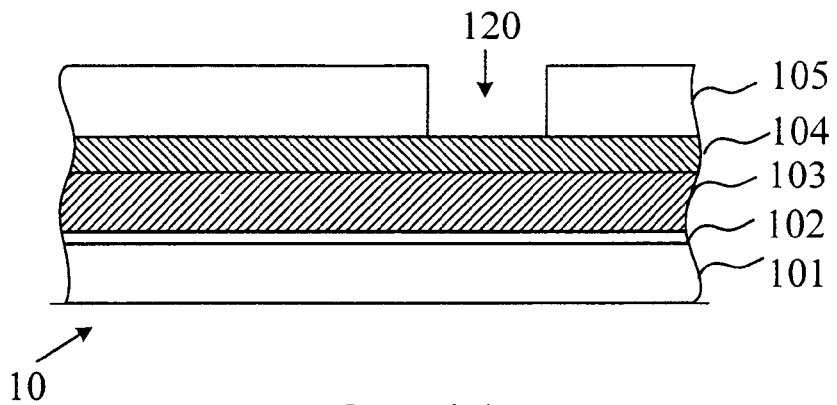
FIGS. 1(a)~(j) show a first prior art manufacturing flow of a flash memory using a self-align contact process.
Figure 1B:
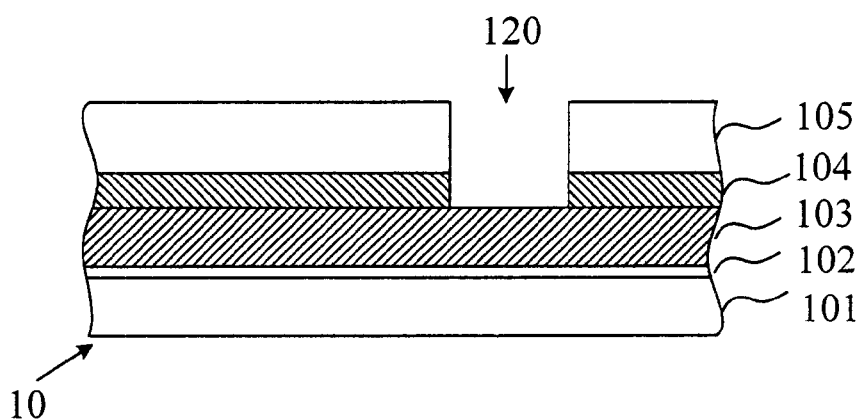
Figure 1C:
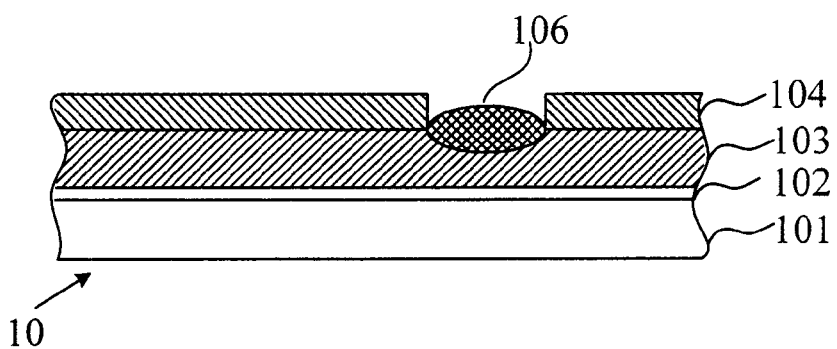
Figure 1D:
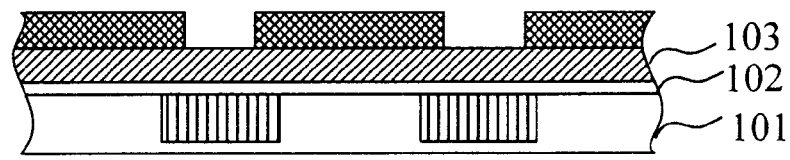
Figure 1E:
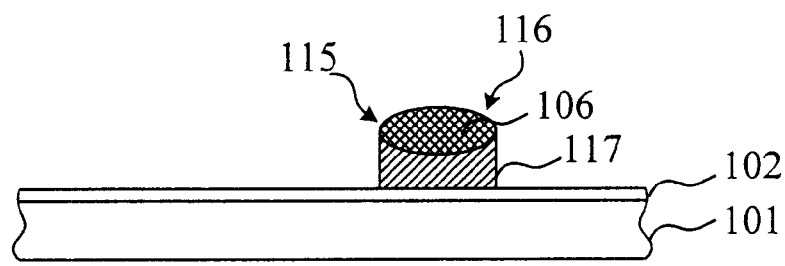
Figure 1F:
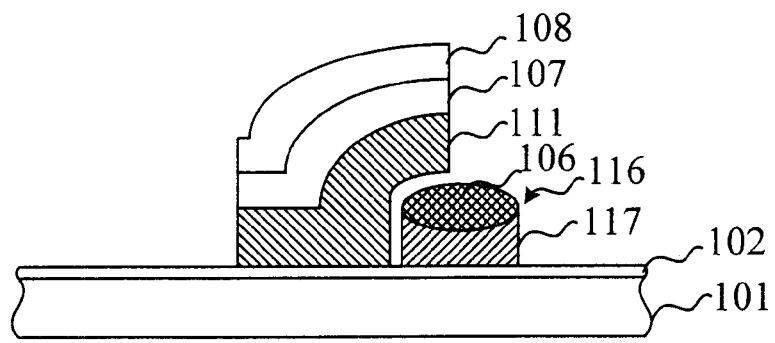
Figure 1G:
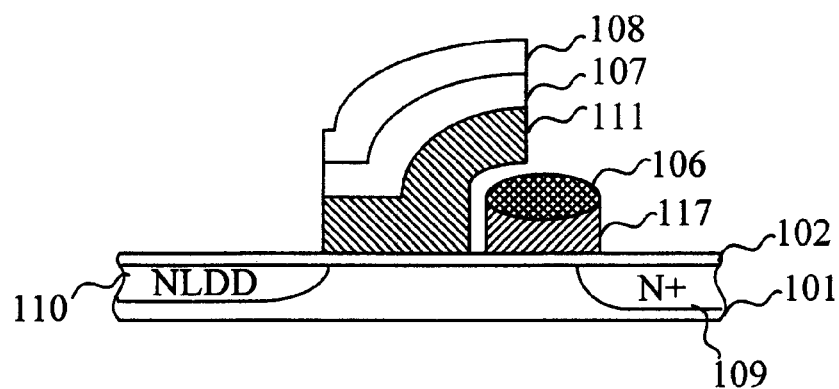
Figure 1H:
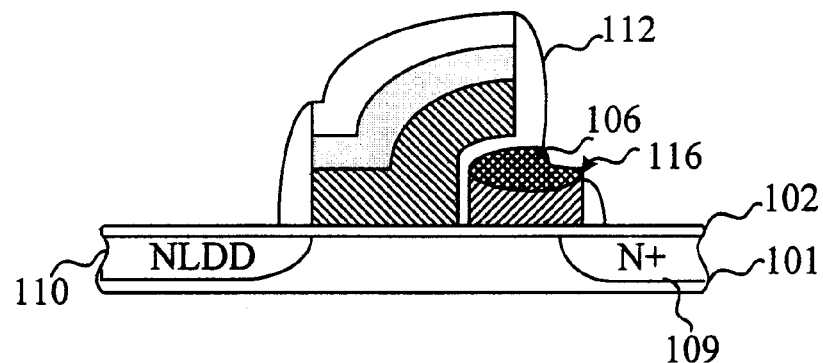
Figure 1I:
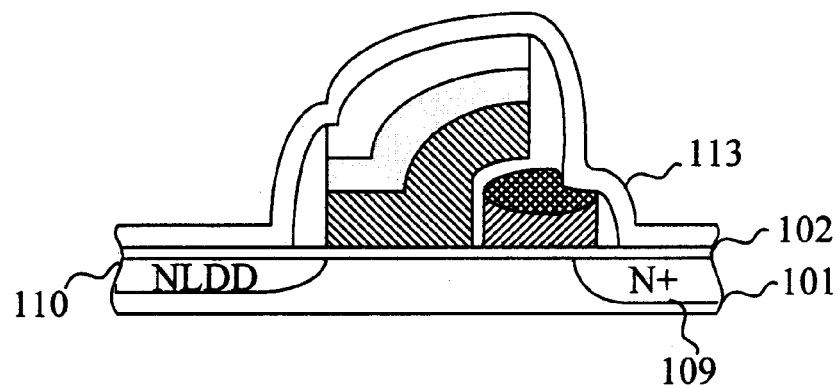
Figure 1J:
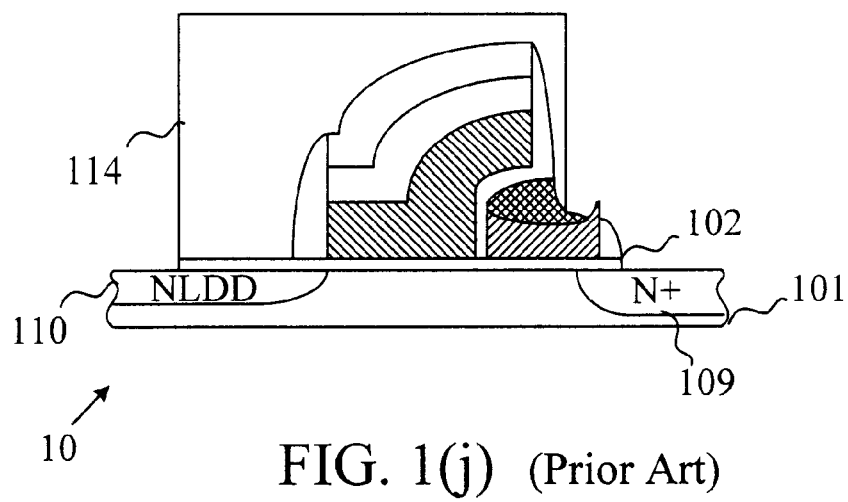
Figure 2A:
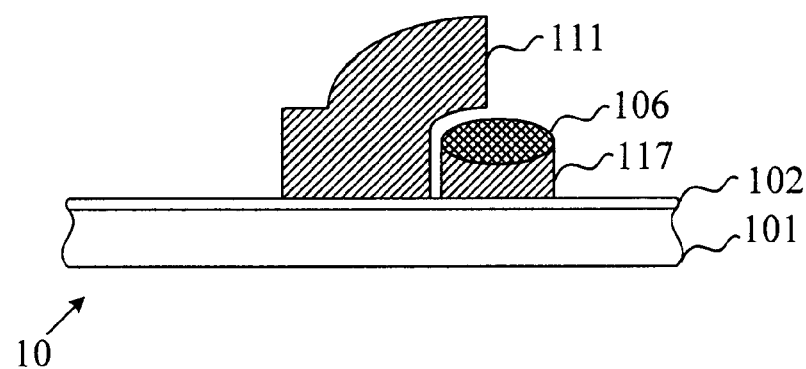
FIGS. 2(a)~(d) show a second prior art manufacturing flow of a flash memory using a fully-salicide-compatible process.
Figure 2B:
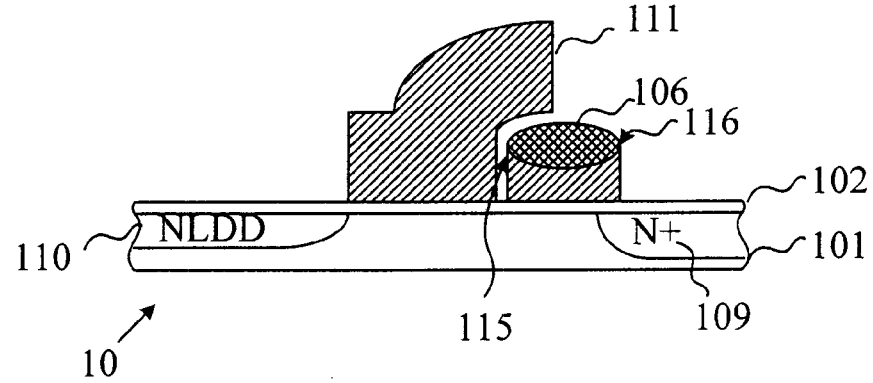
Figure 2C:
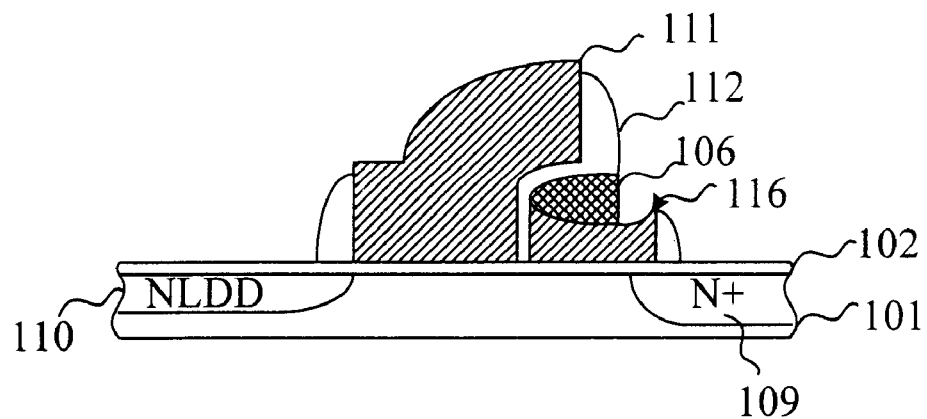
Figure 2D:
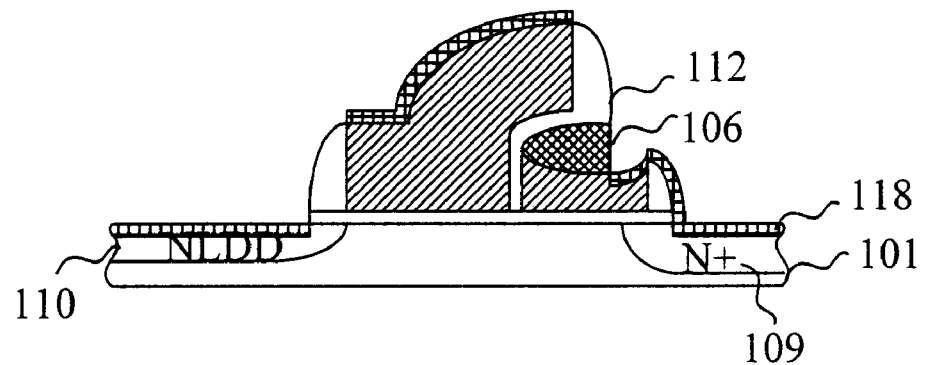
Figure 3A:
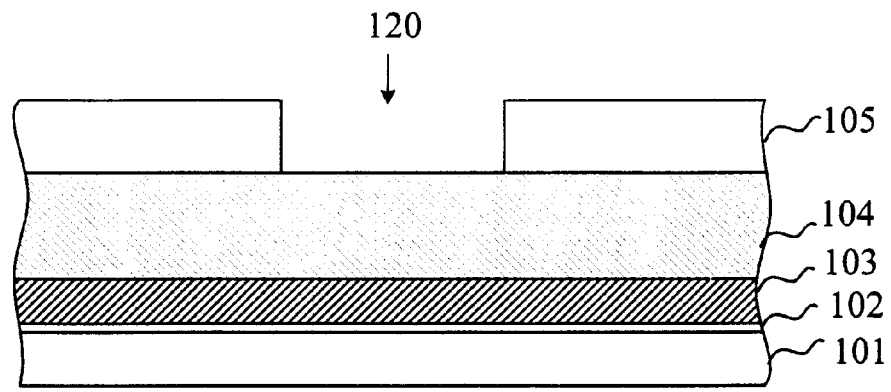
FIGS. 3(a)~(i) show a manufacturing flow of a flash memory using a self-align contact process according to the present invention.
Figure 3B:
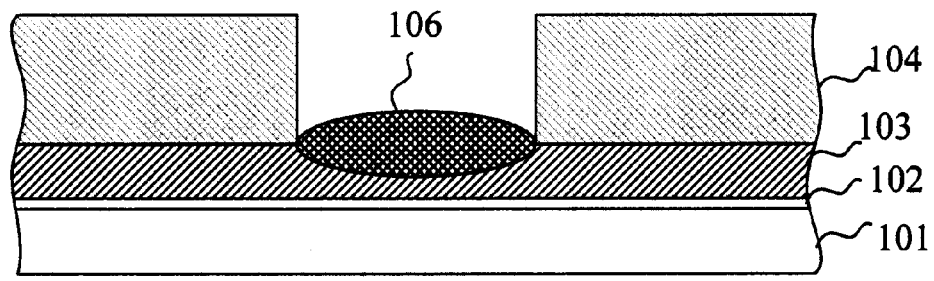
Figure 3C:
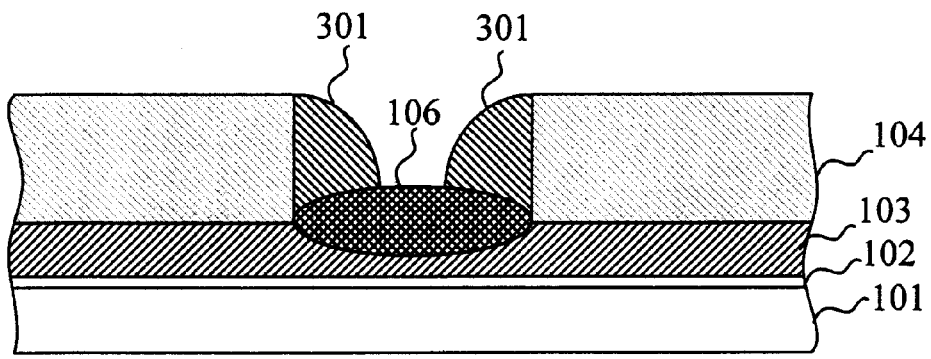
Figure 3D:
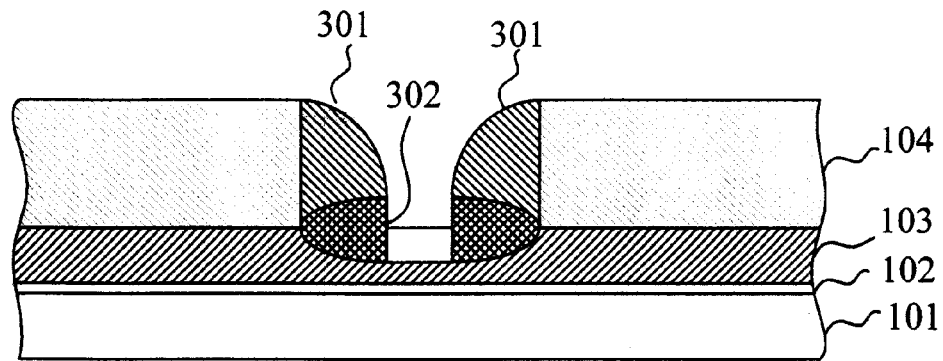
Figure 3E:
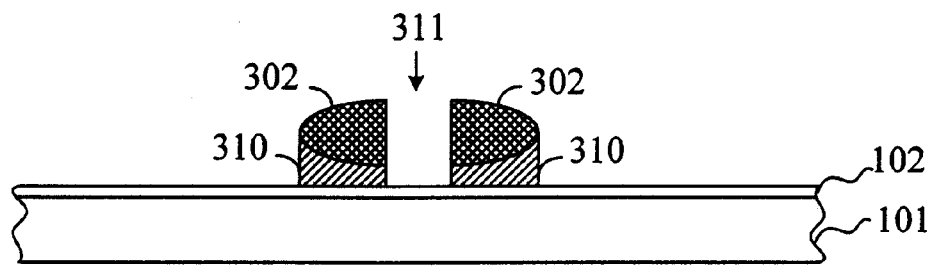
Figure 3F:
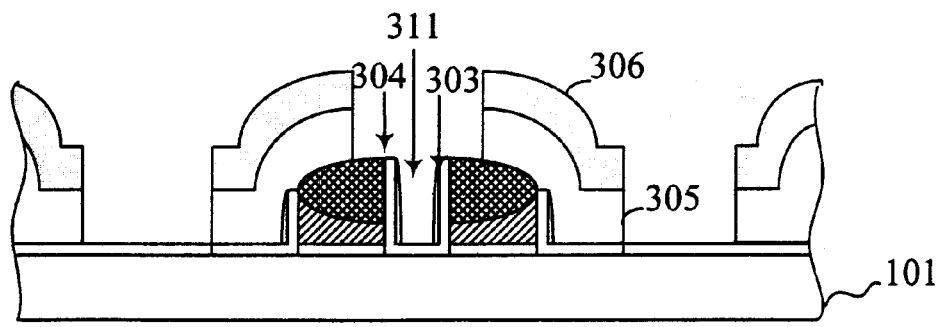
Figure 3G:
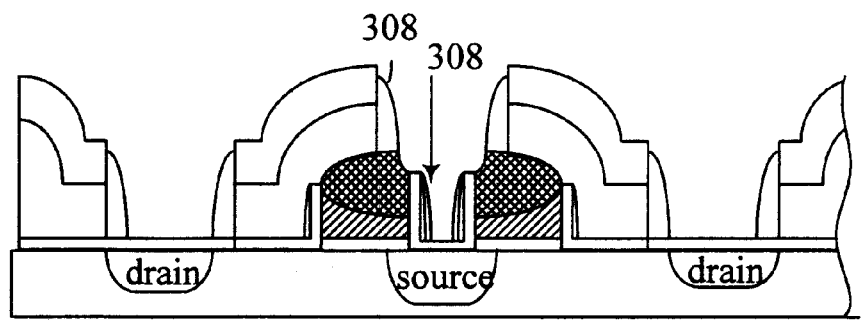
Figure 3H:
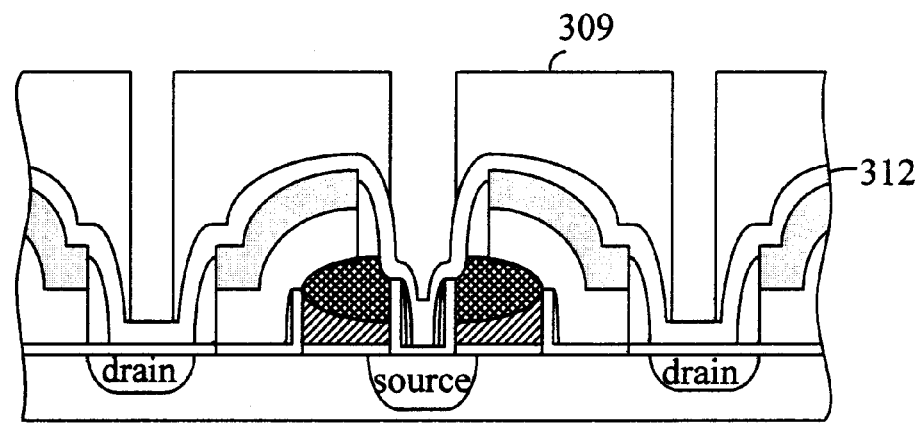
Figure 3I:
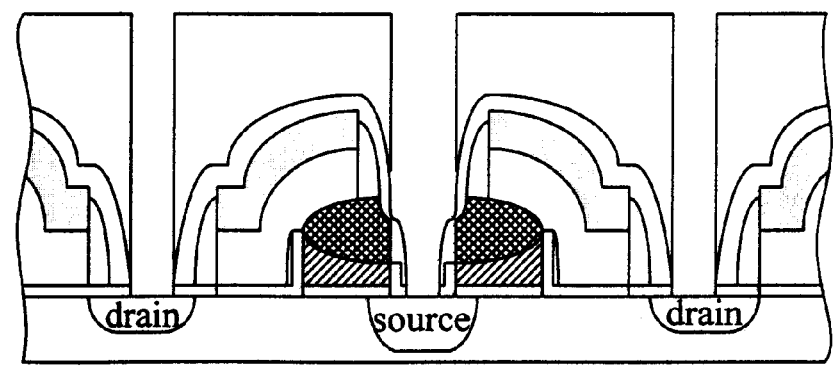

FIGS. 3(a)~(i) show a manufacturing flow of a flash memory using a self-align contact process according to the present invention. In FIG. 3(a), a flash memory 30 comprises a substrate (such as P carrier) 101, a tunnel dielectric layer 102, a first polysilicon layer 103 acting as a floating gate region, a first hard material layer (such as a silicon nitride $Si_3N_4$) 104 and a channel mask 105. The channel mask 105 has an opening 120 for forming a floating gate region. In FIG. 3(b), the silicon nitride layer 104 corresponding to the opening region 120 is etched, thermally forming a polysilicon-oxide region 106. The cross section of the polysilicon-oxide region 106 appears like an ellipse in FIG. 3(b), and on its both sides, a bird's beak effect is induced. In FIG. 3(c), spacer nitrides 301 are deposited on the intersection of the polysilicon-oxide region 106 and the silicon nitride layer 104, and the deposition lengths of both regions are the same. In FIG. 3(d), the polysilicon-oxide region 106 is etched by using the spacer nitride layer 301 as a hard mask. In FIG. 3(e), the spacer nitride layer 301 is removed to form two split gates 302, and the first polysilicon layer 103 is etched by using the split gates as a hard mask, that means all the polysilicon layer except those under the split gates 302 is etched and removed to form a separate gate-split floating gate. The gate-split floating gates has an opening 311, and the polysilicon under a split gate 302 is called "floating gate polysilicon" 310. In FIG. 3(f), an interpoly dielectric layer 304 and a thin nitride spacer 303 are deposited on the inner walls of the opening 311. Besides, a first polysilicon layer (such as a tungsten silicon polysilicon layer; WSi Poly) 305 and a second hard material layer (such as a silicon nitride; cap SiN) 306 are deposited on both sides of the split gate 302. In FIG. 3(g), an annealing process is executed firstly, the source and drain regions are formed by an ion implantation process secondly, and a spacer dielectric layer 308 is deposited to execute a spacer etching lastly. In FIG. 3(h), a nitride barrier layer 312 is deposited to prevent contacts of the flash memory from being etched, an inner dielectric material 309 is formed, and contacts are buried in the source and drain regions. In FIG. 3(i), when the nitride barrier layer 312 is etched and the oxide in the source region is removed, a tungsten plug is deposited. After the above steps, the self-align contact process is done.

We can transfer the self-align contact process shown in FIGS. 3(a)~(i) into the fully-salicide-compatible process, and the advantages of removing invalid peaks and having a complete gate length will be maintained.

Figure 4:
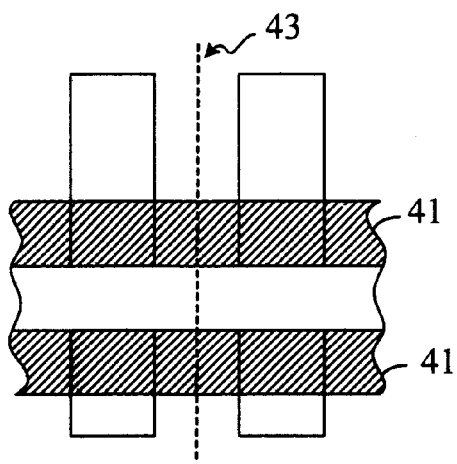
FIGS. 4(a1)~4(d1) show a prior art manufacturing flow of a floating polysilicon mask.
Figure 4:
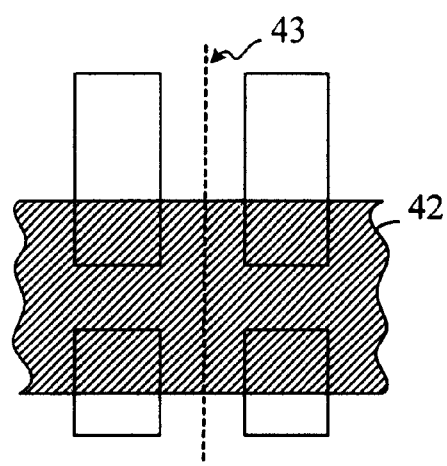
Figure 4:
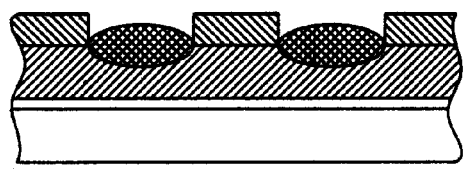
Figure 4:
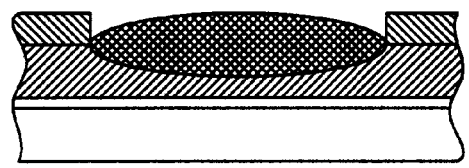
Figure 4:
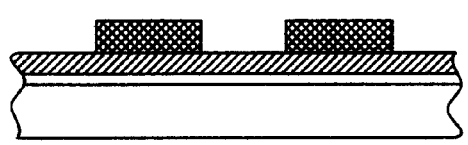
Figure 4:
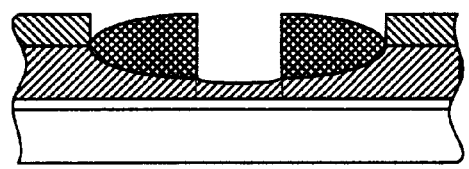
Figure 4:
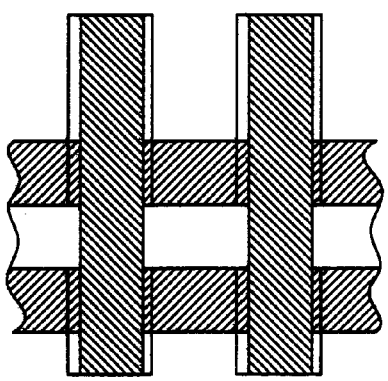
Figure 4:
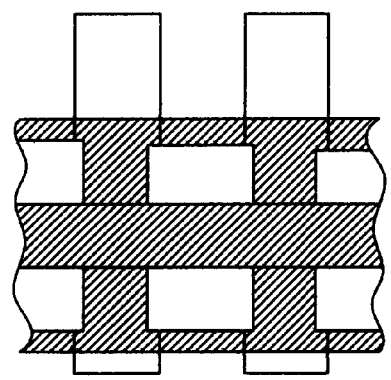
Figure 4:
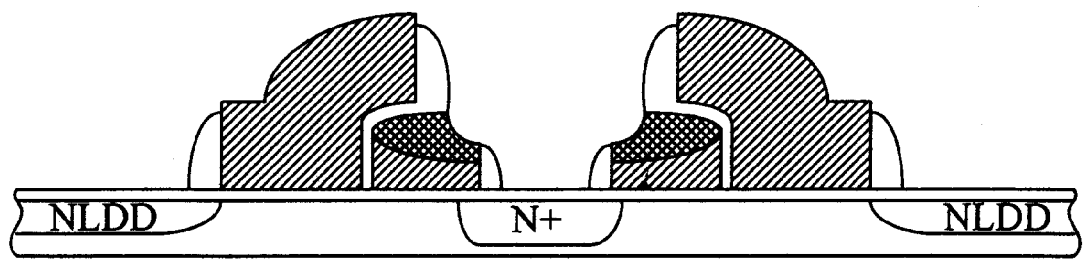

FIG. 4(a1) shows a plan diagram of a prior art floating gate polysilicon mask, and FIG. 4(a2) shows a plan diagram of one embodiment of the floating gate polysilicon mask according to the present invention. Specifically, the present invention utilizes a wider floating gate mask pattern 42 instead of utilizing two narrow floating gate mask patterns 41 in the prior art. In FIG. 4(a2), a straight line 43 represents a sectional line. Similar to the prior art, after the silicon nitride layer is etched, the present invention will generate peaks on both sides after oxidation. FIG. 4(b1) shows a cross-sectional view of the prior art floating gate polysilicon-oxide region, and FIG. 4(b2) shows a cross-sectional view of one embodiment of a floating gate polysilicon-oxide region of the present invention. Next, a gate-split floating gate region is formed by a mask pattern. FIG. 4(c1) shows an X-axis cross-sectional view of one embodiment of a gate-split polysilicon oxidation layer after etching according to the prior art. FIG. 4(c2) shows a Y-axis cross-sectional view of one embodiment of a gate-split polysilicon oxide layer after etching according to the present invention. For improving misalignment in the upper and lower ends, different masks will be utilized sequentially. FIG. 4(d1) shows a layout of the prior art separate mask, and FIG. 4(d2) shows a layout of one embodiment of the separate mask according to the present invention. After the silicon nitride layer is removed and the floating gate polysilicon is etched, we had better remove the oxide covering the peak by etching once or more times, and the other steps are similar to those of prior art. FIG. 4(e) shows a structure diagram after spacer etching of the present invention. After the spacer is etched, it is clearly found that the floating gate near N+ region is covered by an oxide to avoid a short circuit with N+ region.

The manufacturing process of the floating gate polysilicon mask shown in FIGS. 4(a2)~(e2) can be applied to the self-align contact process and fully-salicide-compatible process, and the present invention does not limit the applications.

Figure 5:
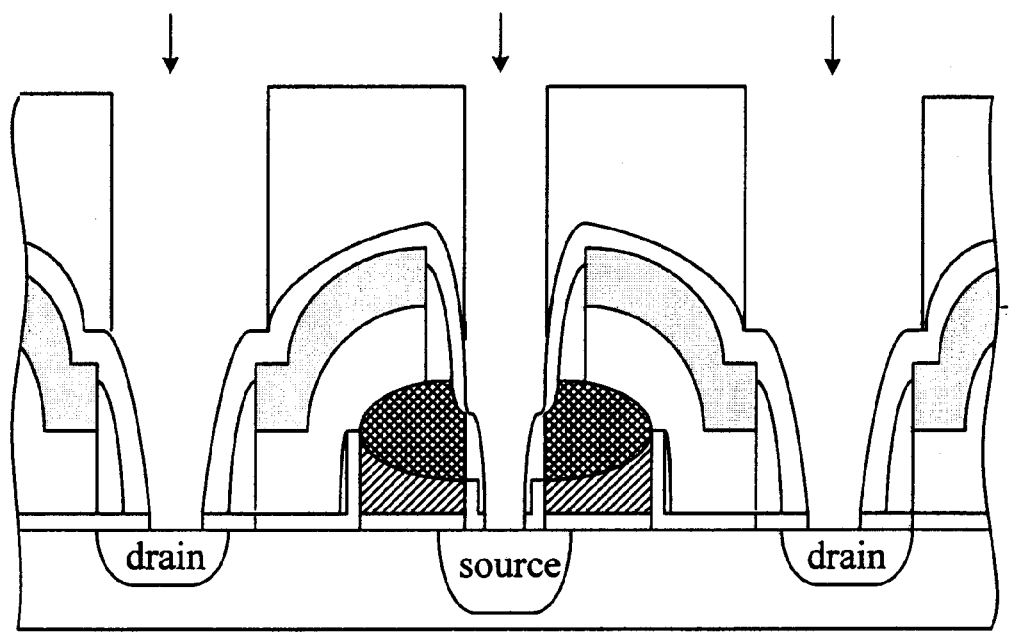
FIG. 5 shows a schematic diagram of contact definitions in source and drain regions in a self-align contact process.

FIG. 5 shows a schematic diagram of contact definitions in source and drain regions in the self-align contact process. The contacts in the source and drain regions can be defined by a mask to speed up the manufacturing process. To meet demand of a controllable process, different masks can be utilized to define the contacts.

The above-described embodiments of the present invention are intended to be illustrative only. Numerous alternative embodiments may be devised by those skilled in the art without departing from the scope of the following claims.

What is claimed is:

1. A method of manufacturing a gate-split flash memory for avoiding invalid peaks to grow in a polysilicon-oxide region, comprising the following steps:

forming a tunnel dielectric layer, a first polysilicon layer and a first hard material layer on a substrate;

defining a floating gate region, etching the first hard material layer corresponding to the floating gate region, and thermally oxidizing the first polysilicon layer corresponding to the floating gate region to form the polysilicon-oxide region;

depositing a spacer layer at the intersection of the polysilicon-oxide region and first hard material layer;

etching the polysilicon-oxide region while using the spacer layer as a hard mask to form a split gate containing an opening; and removing the spacer layer and first hard material layer, and etching the first polysilicon layer while using the split gate as a hard mask to form a separate floating gate.

2. The method of claim 1, applied to a self-align contact process for avoiding a short circuit or current leakage on the polysilicon-oxide region and a source region, further comprising the following steps:

depositing an interpoly dielectric layer and a thin spacer layer on the inner walls of the opening of the split gate;

depositing a second polysilicon layer and a second hard material layer on two sides of the polysilicon-oxide region; and forming the source region and a drain region by an ion implantation process.

3. The method of claim 2, further comprising the following steps:

depositing a barrier layer to prevent a plurality of contacts in the flash memory from being etched; and removing the oxide in the source region and depositing a plug.

4. The method of claim 1, applied to a fully-salicide-compatible process for avoiding a short circuit or current leakage on the polysilicon-oxide region and a source region, further comprising the following steps:

depositing an interpoly dielectric layer and a thin spacer layer on the inner walls of the opening of the split gate;

depositing a second polysilicon layer on two sides of the polysilicon-oxide region and executing an annealing process; and forming the source region and a drain region by an ion implantation process.

5. The method of claim 4, further comprising the following steps:

depositing a spacer dielectric material and etching; and depositing a third polysilicon layer.

6. The method of claim 1, wherein the first hard material layer includes a silicon nitride layer.

7. The method of claim 1, wherein the first hard material layer includes a silicon-oxide-nitride layer.

8. The method of claim 1, wherein the spacer layer is formed by a nitride.

9. The method of claim 3, wherein the contacts in the source and drain regions of the flash memory are formed by a self-align process.

10. The method of claim 5, wherein the third polysilicon layer includes a W-silicide for a stand-alone memory process, or includes a Ti-silicide for an embedded memory process.

11. A method of manufacturing a gate-split flash memory, comprising the following steps:

forming a tunnel dielectric layer, a first polysilicon layer and a first hard material layer on a substrate;

defining a floating gate region, etching the first hard material layer corresponding to the floating gate region, and thermally oxidizing the first polysilicon layer corresponding to the floating gate region to form a polysilicon-oxide region;

defining a split gate having an opening by applying a mask of a pattern to the polysilicon-oxide region;

removing the first hard material layer and etching the first polysilicon layer by using the split gate as a hard mask to form a separate floating gate;

depositing an interpoly dielectric layer and a thin spacer layer on the inner walls of the opening of the split gate;

depositing a second polysilicon layer and a second hard material layer on two sides of the polysilicon-oxide region;

forming the source region and a drain region by an ion implantation process; depositing a barrier layer to prevent a plurality of contacts in the flash memory from being etched; and removing an oxide in the source region and depositing a plug.

12. A method of manufacturing a gate-split flash memory, comprising the following steps:

forming a tunnel dielectric layer, a first polysilicon layer and a first hard material layer a substrate;

defining a floating gate region, etching the first hard material layer corresponding to the floating gate region, and thermally oxidizing the first polysilicon layer corresponding to the floating gate region to form a polysilicon-oxide region;

defining a split gate having an opening by applying a mask of a pattern to the polysilicon-oxide region;

removing the first hard material layer and etching the first polysilicon layer by using the split gate as a hard mask to form a separate floating gate;

depositing an interpoly dielectric layer and a thin spacer layer on the inner walls of the opening of the split gate; opening of the split gate;

depositing a second polysilicon layer on two sides of the polysilicon-oxide region and executing an annealing process; and forming the source region and a drain region by an ion implantation process.

13. The method of claim 12, further comprising the following steps:

depositing a spacer dielectric material and etching; and depositing a third polysilicon layer.

14. The method of claim 11, wherein the first hard material layer includes a silicon nitride layer.

15. The method of claim 11, wherein the first hard material layer includes a silicon-oxide-nitride layer.

16. The method of claim 11, wherein the spacer layer is a nitride.

17. The method of claim 11, wherein the contacts in the source and drain regions of the flash memory are formed by a self-align process.

18. The method of claim 13, wherein the third polysilicon layer includes a W-silicide for a stand-alone memory process, or includes a Ti-silicide for an embedded memory process.

* * * * *